(12) United States Patent
Chen et al.

(10) Patent No.: US 9,087,967 B2
(45) Date of Patent: Jul. 21, 2015

(54) LIGHT-EMITTING DEVICE

(71) Applicant: EPISTAR CORPORATION, Hsinchu, R.O.C. (TW)

(72) Inventors: Shih-I Chen, Hsinch (TW); Tsung-Xian Lee, Hsinchu (TW); Yi-Ming Chen, Hsinchu (TW); Wei-Yu Chen, Hsinchu (TW); Ching-Pei Lin, Hsinchu (TW); Min-Hsun Hsieh, Hsinchu (TW); Cheng-Nan Han, Hsinchu (TW); Tien-Yang Wang, Hsinchu (TW); Hsing-Chao Chen, Hsinchu (TW); Hsin-Mao Liu, Hsinchu (TW); Zong-Xi Chen, Hsinchu (TW); Tzu-Chieh Hsu, Hsinchu (TW); Chien-Fu Huang, Hsinchu (TW); Yu-Ren Peng, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 34 days.

(21) Appl. No.: 13/856,220

(22) Filed: Apr. 3, 2013

(65) Prior Publication Data

US 2014/0070250 A1    Mar. 13, 2014

(30) Foreign Application Priority Data

Apr. 6, 2012   (TW) .............................. 101112423 A
Dec. 26, 2012  (TW) .............................. 101150407 A

(51) Int. Cl.
*H01L 33/00* (2010.01)
*H01L 33/50* (2010.01)
*H01L 33/44* (2010.01)
*H01L 25/075* (2006.01)

(52) U.S. Cl.
CPC .............. *H01L 33/502* (2013.01); *H01L 33/44* (2013.01); *H01L 25/0753* (2013.01); *H01L 33/505* (2013.01)

(58) Field of Classification Search
CPC .............. H01L 33/502; H01L 51/5012; H01L 51/5036; H01L 2251/5384; H01L 27/3211; H01L 21/0259; H01L 2251/5346; H01L 2251/566; H01L 27/3206; G02F 1/1336; G02F 1/133603; G02F 1/133609; G02F 1/133611; G02F 1/1334; G02F 2203/01; G02F 1/133553; G02F 1/1347; G02F 1/133365; G02F 1/133524; G02F 1/133615; G02F 2201/086; G02F 2203/12; H05B 33/145; B29K 2995/0074; B82Y 30/00; C09K 19/544; H04N 9/3197; G09G 3/3648; G09G 2300/0434
USPC ............. 257/13, 14, 40, 43, 714, 77, 79–103, 257/E21.172, E33.068, E21.09, E21.121, 257/E25.02, E33.008, E33.056, E33.063, 257/E33.073, E21.113, E29.068, E33.001, 257/E33.025, E33.06, E33.072, E21.002, 257/E21.006, E21.053, E21.077, E21.091, 257/E21.108, E21.126, E21.127, E21.138, 257/E21.17, E21.19, E21.229, E21.23, 257/E21.347, E21.352, E21.407, E21.411, 257/E21.414, E21.459, E21.475, E21.476, 257/E23.14, E27.121, E29.029, E29.089, 257/E29.09, E29.091, E29.249, E31.002, 257/E31.022, E31.102, E33.061; 438/22, 438/27, 29, 47, 46, 26, 478, 483, 535, 104, 438/24, 28, 33, 34, 35, 45, 479, 48, 480, 438/674, 681, 69, 778, 792, 796, 93, 967; 313/113, 498; 372/36, 50.11, 50.21, 372/96, 38.01, 43.01, 44.01, 45.01, 46.01, 372/75; 264/266, 261, 272.16
See application file for complete search history.

(56) References Cited

U.S. PATENT DOCUMENTS

| | | | | |
|---|---|---|---|---|
| 5,981,428 | A * | 11/1999 | Mitsuhashi et al. | 503/200 |
| 2008/0239458 | A1* | 10/2008 | Sachs et al. | 359/294 |
| 2009/0153837 | A1* | 6/2009 | Wang et al. | 356/43 |
| 2009/0173960 | A1* | 7/2009 | Martin et al. | 257/98 |
| 2013/0026500 | A1* | 1/2013 | Kim | 257/88 |

* cited by examiner

*Primary Examiner* — Colleen A Matthews
*Assistant Examiner* — Junaiden Mirsalahuddin
(74) *Attorney, Agent, or Firm* — Ditthavong & Steiner, P.C.

(57) ABSTRACT

A light-emitting device of an embodiment of the present application comprises a substrate; a first semiconductor light-emitting structure formed on the substrate, wherein the first semiconductor light-emitting structure comprises a first semiconductor layer having a first conductivity type, a second semiconductor layer having a second conductivity type and a first active layer formed between the first semiconductor layer and the second semiconductor layer, wherein the first active layer is capable of emitting a first light having a first dominant wavelength; and a first thermal-sensitive layer formed on a path of the first light, wherein the first thermal-sensitive layer comprises a material characteristic which varies with a temperature change.

20 Claims, 14 Drawing Sheets

US 9,087,967 B2

LIGHT-EMITTING DEVICE

TECHNICAL FIELD

The application relates to a light-emitting device, and more particularly, to a light-emitting device having a thermal-sensitive layer.

REFERENCE TO RELATED APPLICATION

This application claims the right of priority based on TW application Ser. No. 101112423, filed on Apr. 6, 2012; TW application Ser. No. 101150407, filed on Dec. 26, 2012, and the contents of which are hereby incorporated by reference in their entireties.

DESCRIPTION OF BACKGROUND ART

The light-emitting diode (LED) is a solid state semiconductor device. A structure of the light-emitting diode (LED) comprises a p-type semiconductor layer, an n-type semiconductor layer, and an active layer. The active layer is formed between the p-type semiconductor layer and the n-type semiconductor layer. The structure of the LED generally comprises III-V group compound semiconductor such as gallium phosphide (GaP), gallium arsenide (GaAs), or gallium nitride (GaN). The light-emitting principle of the LED is the transformation of electrical energy to optical energy. An external electrical current drives electrons provided from the n-type semiconductor layer and holes provided from the p-type semiconductor layer to combine near p-n junction of the active layer. Then, the LED emits light when the electrons and the holes combine. However, during the combination of electrons and holes, part of electrical energy becomes heat which affects optical-electrical characteristics of the LED, for example, decreases light-emitting efficiency.

To achieve high color rendering and high efficiency of lighting requirements of the LED, a red chip capable of emitting a red light, a blue chip capable of emitting a blue light and a phosphor are usually combined to emit a white light. But, when the external electrical current is injected into the LED, part of electrical energy becomes heat. When the electrical current is continuously injected into the LED, thermal heat continues to accumulate. The accumulated thermal heat causes the temperature of the LED increasing and the light-emitting efficiency of the LED decreasing, while the thermal heat impacts the light-emitting efficiency of the red chip more than that of the blue chip.

As shown in FIG. 1, when the external electrical current is injected into the LED, the temperature of the LED increases from an original temperature to a higher temperature, such as from 25° C. to 75° C. The photo decay dependence on temperature of the red chip is different from that of the blue chip, which leads to the color temperature of the LEDs at 25° C. being different from that of the LEDs at thermal equilibrium. The color temperature of the lighting apparatus therefore shifts and lighting apparatus can fail.

FIG. 1A illustrates a diagram of light intensity dependence on temperature of a conventional red chip. As shown in FIG. 1A, when the external electrical current is injected into the red chip, the temperature of the red chip increases from an original temperature to a higher temperature, such as from 25° C. to 85° C. or above, and the light intensity attenuates with increasing temperature. The attenuation rate of the light intensity versus temperature is approximately −0.87%/deg C. FIG. 1B illustrates a diagram of emission wavelength dependence on temperature of a conventional red chip. As shown in FIG. 1B, when the external electrical current is injected into the red chip, the temperature of the red chip increases from an original temperature to a higher temperature, such as from 25° C. to 85° C. or above, and the emission wavelength shifts towards long wavelength with increasing temperature. When the temperature increases from 25° C. to 100° C., the emission wavelength of the red chip shifts about 5.7 nm.

Generally, electronically controlling method is used to solve the color temperature differences of the LED at thermal equilibrium state and at initial current driving state. However, this method increases the manufacturing cost of LED bulb.

SUMMARY OF THE APPLICATION

A light-emitting device of an embodiment of the present application comprises a substrate; a first semiconductor light-emitting structure formed on the substrate, wherein the first semiconductor light-emitting structure comprises a first semiconductor layer having a first conductivity type, a second semiconductor layer having a second conductivity type and a first active layer formed between the first semiconductor layer and the second semiconductor layer, wherein the first active layer is capable of emitting a first light having a first dominant wavelength; and a first thermal-sensitive layer formed on a path of the first light, wherein the first thermal-sensitive layer comprises a material characteristic which varies with a temperature change.

DETAILED DESCRIPTION OF PREFERRED EMBODIMENTS

Figure 1:
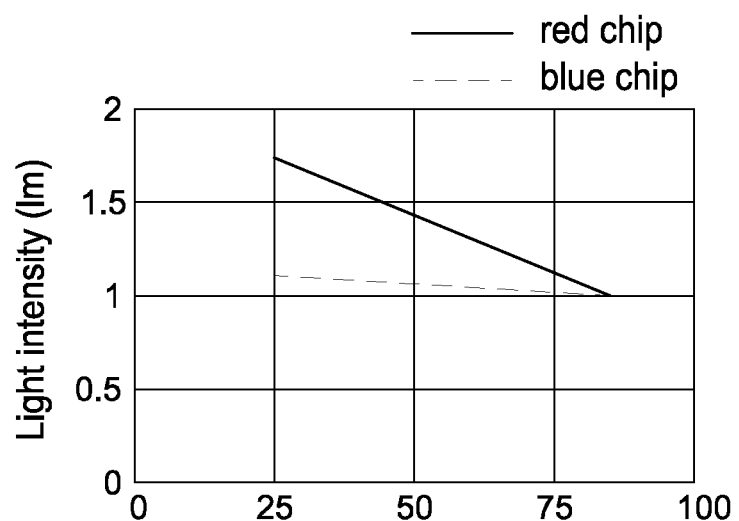
FIG. 1 illustrates a diagram of light intensity dependence on temperature of a conventional red chip.

The embodiment of the application is illustrated in detail, and is plotted in the drawings. The same or the similar part is illustrated in the drawings and the specification with the same number.

Figure 2:
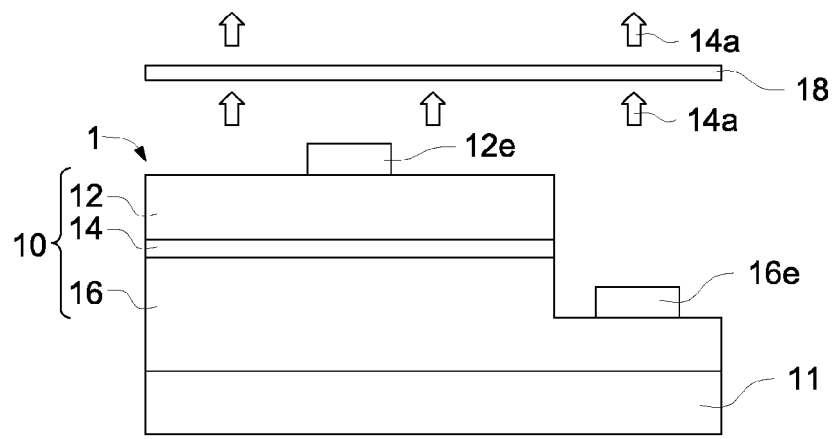
FIG. 2 illustrates a diagram of a light-emitting device in accordance with a first embodiment of the present application.

FIG. 2 illustrates a cross-sectional diagram of a light-emitting device 1 in accordance with a first embodiment of the present application. The light-emitting device 1 comprises a substrate 11; a first semiconductor light-emitting structure 10 formed on the substrate 11, wherein the first semiconductor light-emitting structure 10 comprises a first semiconductor layer 12 having a first conductivity type, a second semiconductor layer 16 having a second conductivity type, and a first active layer 14 formed between the first semiconductor layer 12 and the second semiconductor layer 16, wherein the first active layer 14 is capable of emitting a first light 14a having a first dominant wavelength; and a first thermal-sensitive layer 18 formed on a path of the first light 14a, wherein the first thermal-sensitive layer 18 comprises a material characteristic which varies with the temperature change.

The material of the first semiconductor light-emitting structure 10 comprises an element selected from a group consisting of arsenic (As), gallium (Ga), aluminum (Al), indium (In), phosphorus (P), nitrogen (N), zinc (Zn), cadmium (Cd), and selenium (Se). In an embodiment of the present application, the first conductivity type of the first semiconductor layer 12 is different from the second conductivity type of the second semiconductor layer 16. For example, the first semiconductor layer 12 can be an n-type semiconductor layer and the second semiconductor layer 16 can be a p-type semiconductor layer. The electrons provided from the n-type semiconductor layer and the holes provided from the p-type semiconductor layer combine in the first active layer 14 to emit the first light 14a under an external electrical current driving. The method for forming the first semiconductor light-emitting structure 10 is not particularly limited. The first semiconductor light-emitting structure 10 may be formed by a known epitaxy method such as metallic-organic chemical vapor deposition (MOCVD) method, a molecular beam epitaxy (MBE) method, a hydride vapor phase epitaxy (HVPE) method, sputtering or electrical plating. The material of the substrate 11 comprises germanium (Ge), gallium arsenide (GaAs), indium phosphide (InP), gallium phosphide (GaP), sapphire, silicon carbide (SiC), silicon (Si), lithium aluminate ($LiAlO_2$), zinc oxide (ZnO), gallium nitride (GaN), aluminum nitride (AlN). The substrate 11 can be used to support and/or grow the first semiconductor light-emitting structure 10.

Figure 3:
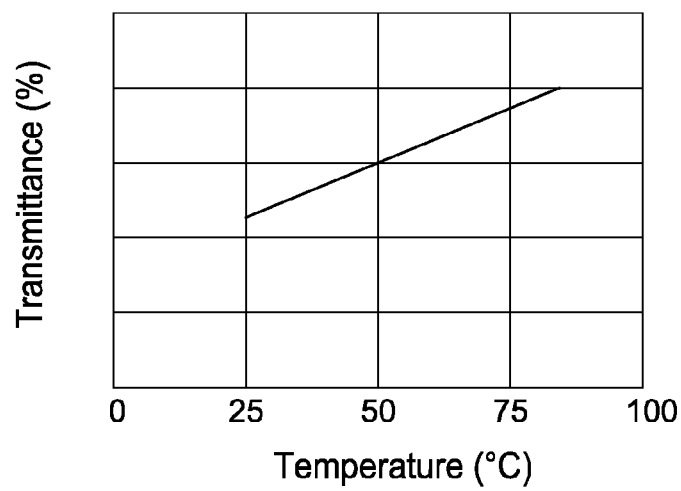
FIG. 3 illustrates a diagram of transmittance dependence on temperature of a thermal-sensitive material of the present application.

The material characteristic of the first thermal-sensitive layer 18 comprises transmittance which varies with the temperature change. The transmittance is proportional to the temperature. Specifically, the transmittance increases with increasing temperature. The material of the first thermal-sensitive layer 18 comprises organic compound or inorganic compound. The organic compound comprises esters or phenols, for example, crystal violet lactone, malachite green lactone, or cresol red, or metal organic complex compound, for example, copper complex compound, or liquid crystal. The inorganic compound comprises inorganic salts, such as vanadate or chromate, or inorganic crystals, such as mercuric iodide, silver iodide or vanadium oxide. When the organic compound or the inorganic compound is used as the material of the first thermal-sensitive layer 18, the transmittance of the material varies with the temperature change of the light-emitting device 1. As shown in FIG. 3, the transmittance of the material increases with increasing temperature. The characteristic of the material is reversible, and the material can be reused. When the temperature gets back, the transmittance also gets back to a value before temperature increasing. With the transmittance dependence on temperature of the material of the first thermal-sensitive layer 18, the color temperature variation of the light-emitting device 1 is improved.

Figure 4:
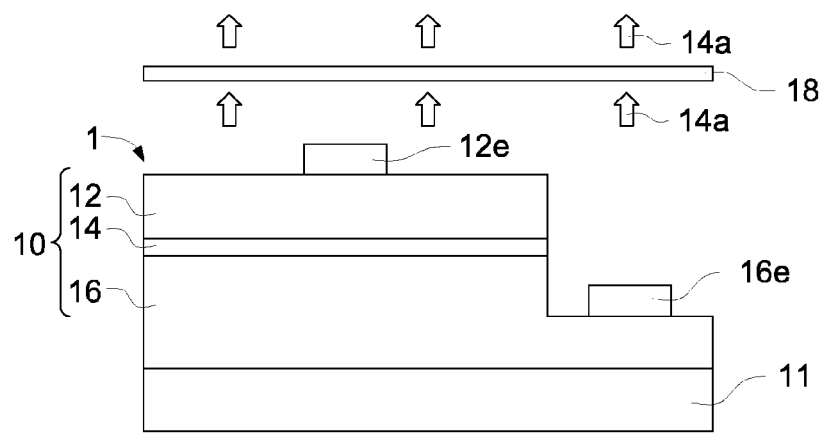
FIG. 4 illustrates a diagram of a light-emitting device in accordance with a first embodiment of the present application.

As shown in FIG. 2 and FIG. 3, with the characteristic of the low transmittance at low temperature, such as 25° C., of the first thermal-sensitive layer 18, part of the first light 14a is blocked and less of the first light 14a can be transmitted through the first thermal-sensitive layer 18. As shown in FIG. 3 and FIG. 4, an electrical current is injected into the light-emitting device 1 through a first electrode 12e and a second electrode 16e, the temperature of the light-emitting device 1 increases from a lower temperature, such as 25° C., to a higher temperature, such as 85° C., the transmittance of the first thermal-sensitive layer 18 increases with increasing temperature, and more of the first light 14a can be transmitted through the first thermal-sensitive layer 18. In accordance with an embodiment of the present application, with the characteristic that the transmittance of the first thermal-sensitive layer 18 is higher at high temperature, such as 85° C., than that at low temperature, such as 25° C., and with the characteristic that the light intensity of the light-emitting device 1 is lower at high temperature, such as 85° C., than that at low temperature, such as 25° C., the color temperature variation of the light-emitting device 1 is improved.

In accordance with another embodiment of the present application, the material characteristic of the first thermal-sensitive layer 18 of the light-emitting device 1 comprises refractive index. The first thermal-sensitive layer 18 comprises a first material having a first refractive index, such as liquid crystal, and a second material having a second refractive index, such as resin, wherein the first refractive index and the second refractive index vary with temperature changes.

When a junction temperature of the first active layer 14 is below 60° C., the first refractive index is different from the second refractive index; when a junction temperature of the first active layer 14 is above 60° C., a difference between the first refractive index and the second refractive index is substantially smaller than 10%. With the characteristic that the difference between the first refractive index and the second refractive index is larger than 10% at low temperature, such as 25° C., part of the first light 14a emitted from the light-emitting device 1 can be scattered and less of the first light 14a can be transmitted through the first thermal-sensitive layer 18. When the electrical current is injected into the light-emitting device 1 through the first electrode 12e and the second electrode 16e, the temperature of the light-emitting device 1 increases from a lower temperature, such as 25° C., to a higher temperature, such as 85° C., wherein the difference between the first refractive index and the second refractive index is substantially smaller than 10%, and more of the first light 14a can be transmitted through the first thermal-sensitive layer 18. In the embodiment of the present application, with the characteristic that the difference between the first refractive index and the second refractive index is substantially smaller than 10% at high temperature, such as 85° C., and with the characteristic that the light intensity of the light-emitting device 1 is lower at high temperature, such as 85° C., than that at low temperature, such as 25° C., the color temperature variation of the light-emitting device 1 is improved.

In accordance with another embodiment of the present application, the material of the first thermal-sensitive layer 18 of the light-emitting device 1 can be liquid crystal. The material characteristic comprises an arrangement of the liquid crystal molecules, wherein the arrangement of the liquid crystal molecules varies with the temperature change. The thermal-sensitive material, such as liquid crystal, comprises a stack structure, wherein major axes of the liquid crystal molecules in one layer of the stack structure are mutually parallel, but major axes of the liquid crystal molecules in adjacent one layer of the stack structure deviate from major axes of the liquid crystal molecules of the one layer of the stack structure. Overall, the liquid crystal molecules of the stack structure form a helical structure, and a periodic pitch is formed between layer and layer. The temperature change changes the pitch, different pitches reflect different wavelengths. With the characteristic described above, more of the first light 14a emitted from the light-emitting device 1 can be scattered at a lower temperature, such as 25° C., and more of the first light 14a can be transmitted through the first thermal-sensitive layer 18 at a higher temperature, such as 85° C., and with the characteristic that the light intensity of the light-emitting device 1 is lower at high temperature, such as 85° C., than that at low temperature, such as 25° C., the color temperature variation of the light-emitting device 1 is improved.

Figure 5:
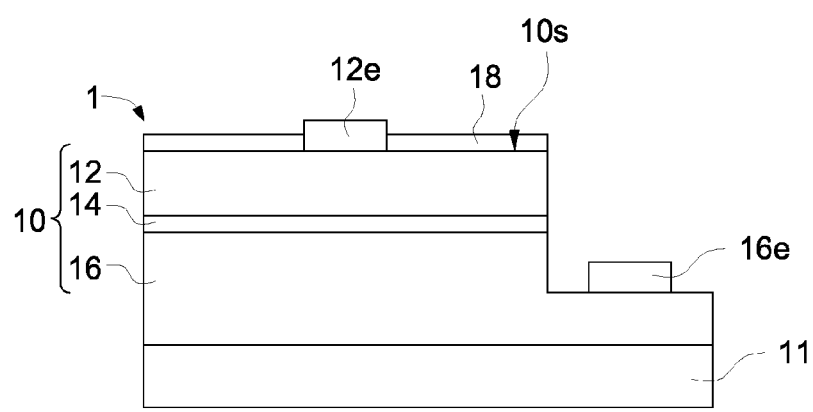
FIG. 5 illustrates a diagram of a light-emitting device in accordance with a first embodiment of the present application.

As shown in FIG. 5, the first thermal-sensitive layer 18 of the light-emitting device 1 can be formed on at least one surface 10s of the first semiconductor light-emitting structure 10, and preferably, the first thermal-sensitive layer 18 contacts with at least one surface 10s of the first semiconductor light-emitting structure 10.

Figure 6:
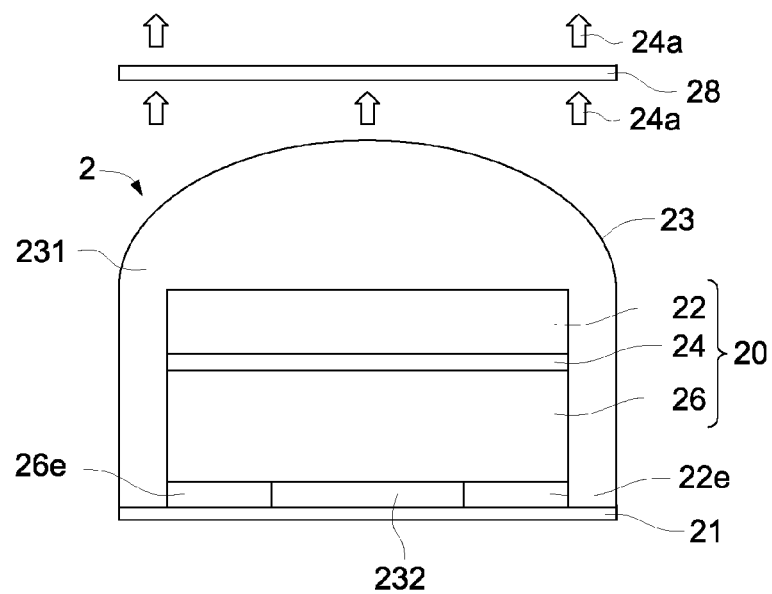
FIG. 6 illustrates a diagram of a light-emitting device in accordance with a second embodiment of the present application.

FIG. 6 illustrates a cross-sectional diagram of a light-emitting device 2 in accordance with a second embodiment of the present application. The light-emitting device 2 comprises a substrate 21; a first semiconductor light-emitting structure 20 formed on the substrate 21, wherein the first semiconductor light-emitting structure 20 comprises a first semiconductor layer 22 having a first conductivity type, a second semiconductor layer 26 having a second conductivity type and a first active layer 24 formed between the first semiconductor layer 22 and the second semiconductor layer 26, wherein the first active layer 24 is capable of emitting a first light 24a having a first dominant wavelength; a light-pervious layer 23 covering the first semiconductor light-emitting structure 20; and a first thermal-sensitive layer 28 formed on a path of the first light 24a, wherein the first thermal-sensitive layer 28 comprises a material characteristic which varies with the temperature change.

As shown in FIG. 6, the light-pervious layer 23 comprises a transparent material 231, and the transparent material 231 can be organic material or inorganic material. The organic material comprises epoxy, polymethylmethacrylate (PMMA), or silicone. The inorganic material comprises glass. The manufacturing method of the light-pervious layer 23 is not particularly limited, in addition to potting, the light-pervious layer 23 can also be formed by low-pressure transfer molding or adhesion. The first light 24a emitted from the first semiconductor light-emitting structure 20 can be transmitted to the environment through the light-pervious layer 23. The light-pervious layer 23 also provides electrical insulation and heat resistance. The light-pervious layer 23 protects the first semiconductor light-emitting structure 20 from being directly exposed to the environment.

The material of the first semiconductor light-emitting structure 20 comprises an element selected from a group consisting of arsenic (As), gallium (Ga), aluminum (Al), indium (In), phosphorus (P), nitrogen (N), zinc (Zn), cadmium (Cd) and selenium (Se). In an embodiment of the present application, the first conductivity type of the first semiconductor layer 22 is different from the second conductivity type of the second semiconductor layer 26. For example, the first semiconductor layer 22 can be an n-type semiconductor layer and the second semiconductor layer 26 can be a p-type semiconductor layer. The electrons provided from the n-type semiconductor layer and the holes provided from the p-type semiconductor layer combine in the first active layer 24 to emit the first light 24a under an external electrical current driving. The manufacturing method of the first semiconductor light-emitting structure 20 is not particularly limited, the first semiconductor light-emitting structure 20 may be formed by a known epitaxy method such as metallic-organic chemical vapor deposition (MOCVD) method, a molecular beam epitaxy (MBE) method, a hydride vapor phase epitaxy (HVPE) method, sputtering, or electrical plating.

The first semiconductor light-emitting structure 20 can be formed on the substrate 21 by glue bonding or metal bonding. The substrate 21 comprises conductive material, such as metal. The first semiconductor light-emitting structure 20 further comprises a first electrode 22e and a second electrode 26e, wherein a position of the first electrode 22e or the second electrode 26e is not particularly limited. The first electrode 22e and the second electrode 26e can be formed on a same side of the first semiconductor light-emitting structure 20 to form a horizontal structure as shown in FIG. 6. The first electrode 22e and the second electrode 26e also can be formed on opposite sides of the first semiconductor light-emitting structure 20 to form a vertical structure (not shown). As shown in FIG. 6, a cavity 232 formed between the first electrode 22e and the second electrode 26e comprises insulated glue material or air when the first electrode 22e and the second electrode 26e are formed on the same side of the first semiconductor light-emitting structure 20.

The material characteristic of the first thermal-sensitive layer 28 comprises transmittance which varies with the temperature change. The transmittance is proportional to the temperature. Specifically, the transmittance increases when the temperature is raised. The material of the first thermal-sensitive layer 28 comprises organic compound or inorganic compound. The organic compound comprises esters or phenols, for example, crystal violet lactone, malachite green lactone, or cresol red, or metal organic complex compound, for example, copper complex compound, or liquid crystal. The inorganic compounds comprise inorganic salts, such as vanadate or chromate, or inorganic crystals, such as mercuric iodide, silver iodide or vanadium oxide. When the organic compound or the inorganic compound is used as the material of the first thermal-sensitive layer 28, the transmittance of the material varies with the temperature change of the light-emitting device 2. As shown in FIG. 3, the transmittance of the material increases with increasing temperature. The material is reversible and can be reused. When the temperature gets back, the transmittance also gets back to a value before temperature increasing. With the transmittance dependence on temperature of the thermal-sensitive material of the first thermal-sensitive layer 28, the color temperature variation of the light-emitting device 2 is improved.

As shown in FIG. 6, with the characteristic of the low transmittance at low temperature, such as 25° C., of the first thermal-sensitive layer 28, part of the first light 24a is blocked by the first thermal-sensitive layer 28 and part of the first light 24a is transmitted through the first thermal-sensitive layer 28. An electrical current is injected into the first electrode 22e and the second electrode 26e of the light-emitting device 2 through the substrate 21. When the electrical current is injected into the light-emitting device 2, the temperature of the light-emitting device 2 increases from a low temperature, such as 25° C., to a high temperature, such as 85° C., the transmittance of the first thermal-sensitive layer 28 increases with increasing temperature, and more of the first light 24a can be transmitted through the first thermal-sensitive layer 28. In accordance with an embodiment of the present application, with the characteristic that the transmittance of the first thermal-sensitive layer 28 is higher at high temperature, such as 85° C., than that at low temperature, such as 25° C., and with the characteristic that the light intensity of the light-emitting device 2 is lower at high temperature, such as 85° C., than that at low temperature, such as 25° C., the color temperature variation of the light-emitting device 2 is improved.

In accordance with another embodiment of the present application, the material characteristic of the first thermal-sensitive layer 28 of the light-emitting device 2 comprises refractive index. The first thermal-sensitive layer 28 comprises a first material having a first refractive index, such as liquid crystal, and a second material having a second refractive index, such as resin, wherein the first refractive index and the second refractive index vary with temperature changes. When a junction temperature of the first active layer 24 is below 60° C., the first refractive index is different from the second refractive index; when a junction temperature of the first active layer 24 is above 60° C., a difference between the first refractive index and the second refractive index is substantially smaller than 10%.

In accordance with another embodiment of the present application, the material of the first thermal-sensitive layer 28 of the light-emitting device 2 can be liquid crystal. The material characteristic comprises an arrangement of the liquid crystal molecules. With the characteristic of the liquid crystal, more of the first light 24a emitted from the light-emitting device 2 can be scattered at low temperature, such as 25° C., and more of the first light 24a can be transmitted through the first thermal-sensitive layer 28 at high temperature, such as 85° C., and with the characteristic that the light intensity of the light-emitting device 2 is lower at high temperature, such as 85° C., than that at low temperature, such as 25° C., the color temperature variation of the light-emitting device 2 is improved.

Figure 7:
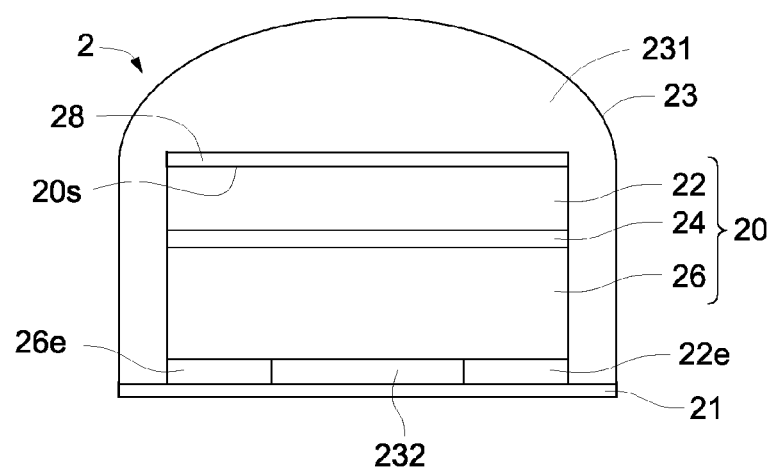
FIG. 7 illustrates a diagram of a light-emitting device in accordance with a second embodiment of the present application.

As shown in FIG. 7, the first thermal-sensitive layer 28 of the light-emitting device 2 can be formed on at least one surface 20s of the first semiconductor light-emitting structure 20, and preferably, the first thermal-sensitive layer 28 contacts with at least one surface 20s of the first semiconductor light-emitting structure 20.

Figure 8:
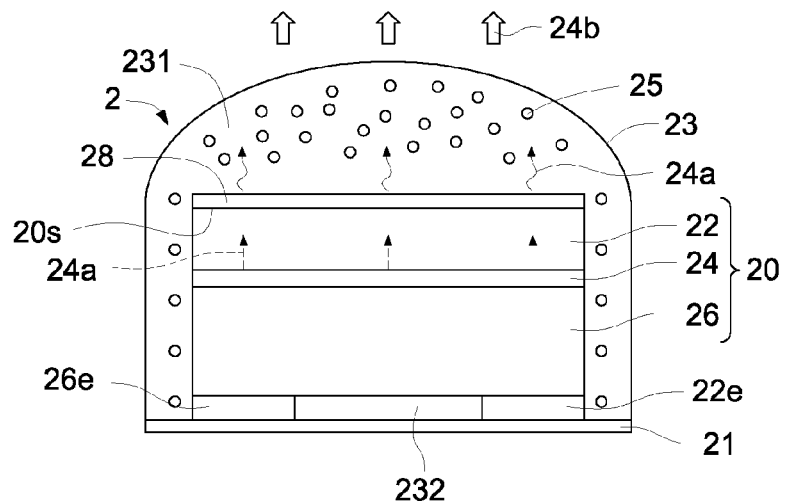
FIG. 8 illustrates a diagram of a light-emitting device in accordance with a second embodiment of the present application.

The light-emitting device 2 further comprises a wavelength converting material 25 formed on a path of the first light 24a, wherein the wavelength converting material 25 comprising phosphor is capable of absorbing the first light 24a emitted from the first active layer 24 and emitting a third light 24b having a third dominant wavelength. FIG. 8 illustrates an example that the wavelength converting material 25 can be mixed with the transparent material 231 of the light-pervious layer 23.

Figure 9:
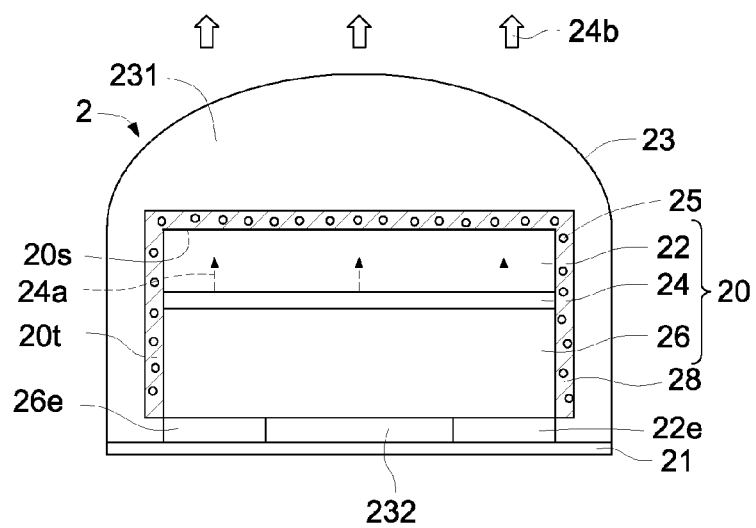
FIG. 9 illustrates a diagram of a light-emitting device in accordance with a second embodiment of the present application.

As shown in FIG. 9, the first thermal-sensitive layer 28 of the light-emitting device 2 can be formed on the surface 20s of the first semiconductor light-emitting structure 20 and covers at least one side surface 20t of the first semiconductor light-emitting structure 20. In another example, the first thermal-sensitive layer 28 contacts with the side surface 20t, wherein the wavelength converting material 25 can be added into the first thermal-sensitive layer 28.

Figure 10:
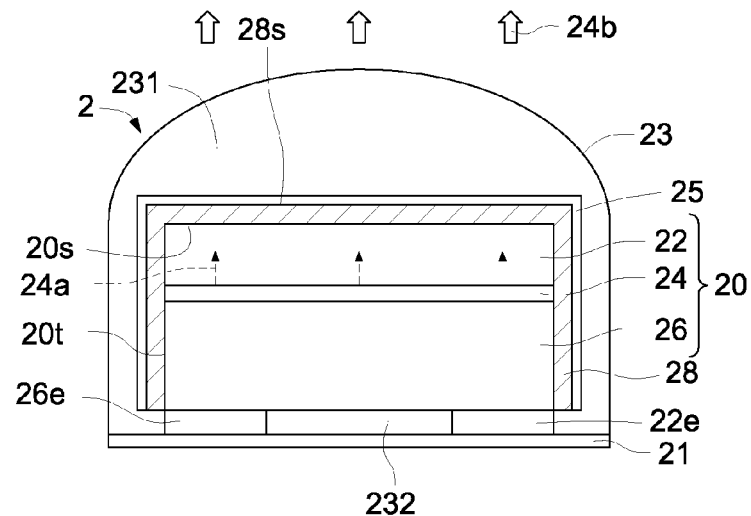
FIG. 10 illustrates a diagram of a light-emitting device in accordance with a second embodiment of the present application.

As shown in FIG. 10, the first thermal-sensitive layer 28 of the light-emitting device 2 can be formed on the surface 20s of the first semiconductor light-emitting structure 20, and covers at least one side surface 20t of the first semiconductor light-emitting structure 20. In another example, the first thermal-sensitive layer 28 contacts with the side surface 20t, wherein the wavelength converting material 25 can be formed on at least one surface 28s of the first thermal-sensitive layer 28 through an adhesion material, such as resin.

Figure 11:
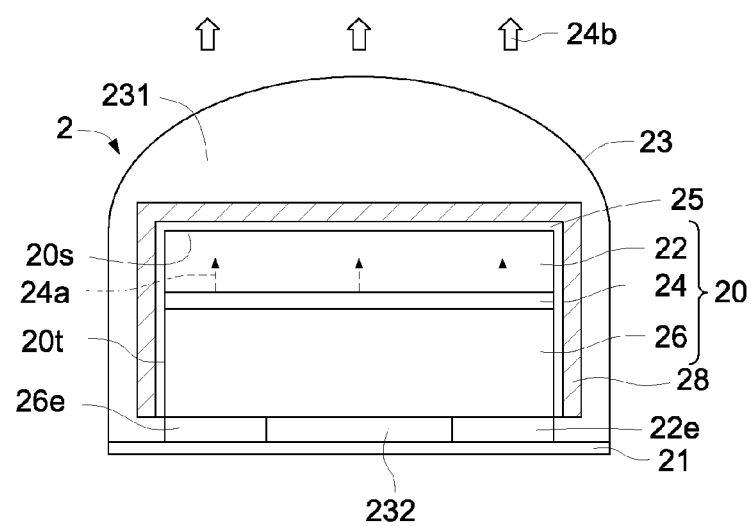
FIG. 11 illustrates a diagram of a light-emitting device in accordance with a second embodiment of the present application.

As shown in FIG. 11, the first thermal-sensitive layer 28 of the light-emitting device 2 can be formed on the surface 20s of the first semiconductor light-emitting structure 20, and covers at least one side surface 20t of the first semiconductor light-emitting structure 20. The wavelength converting material 25 can be formed on the surface 20s and the side surface 20t of the first semiconductor light-emitting structure 20 through an adhesion material, such as resin. In another example, the wavelength converting material 25 can contact with the surface 20s and the side surface 20t.

Figure 12:
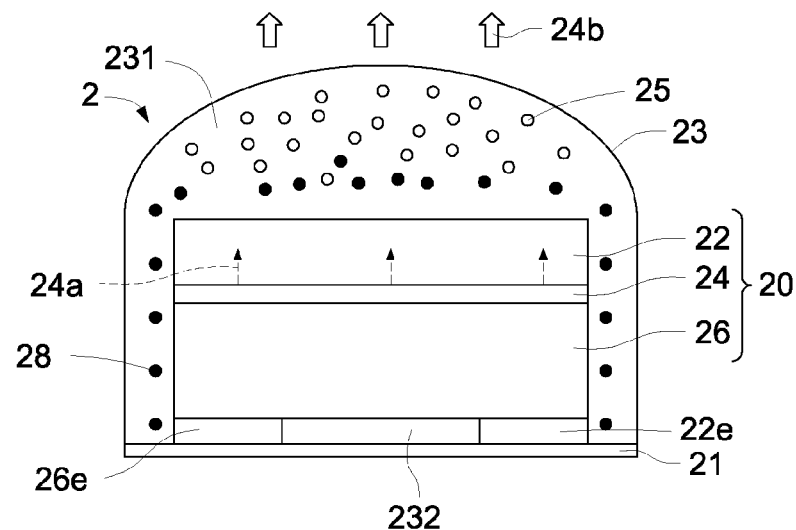
FIG. 12 illustrates a diagram of a light-emitting device in accordance with a second embodiment of the present application.

As shown in FIG. 12, the material of the first thermal-sensitive layer 28 of the light-emitting device 2 and the wavelength converting material 25 can be added into the transparent material 231 of the light-pervious layer 23.

Figure 13:
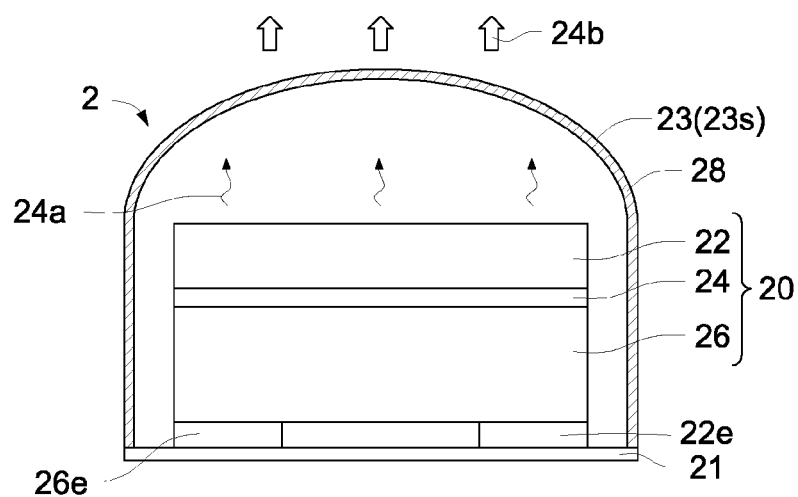
FIG. 13 illustrates a diagram of a light-emitting device in accordance with a second embodiment of the present application.

As shown in FIG. 13, the first thermal-sensitive layer 28 of the light-emitting device 2 can be formed on the surface 23s of the light-pervious layer 23, and preferably, the first thermal-sensitive layer 28 contacts with the surface 23s of the light-pervious layer 23.

Figure 14:
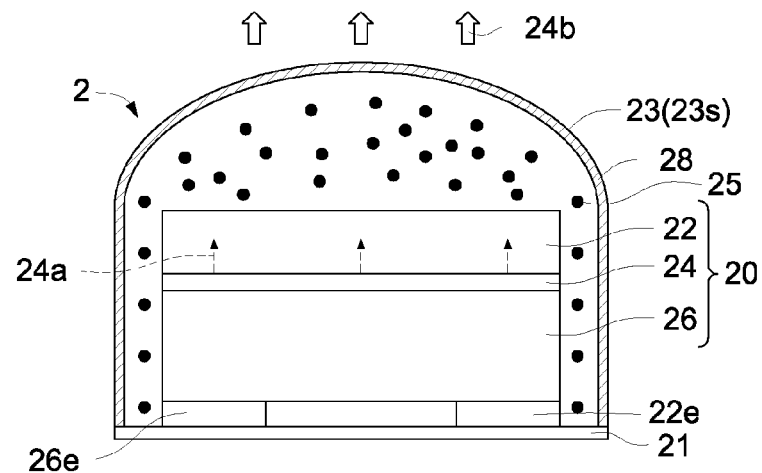
FIG. 14 illustrates a diagram of a light-emitting device in accordance with a second embodiment of the present application.

As shown in FIG. 14, the first thermal-sensitive layer 28 of the light-emitting device 2 can be formed on the surface 23s of the light-pervious layer 23, and preferably, the first thermal-sensitive layer 28 contacts with the surface 23s of the light-pervious layer 23, and the wavelength converting material 25 can be added into the transparent material 231 of the light-pervious layer 23.

Figure 15:
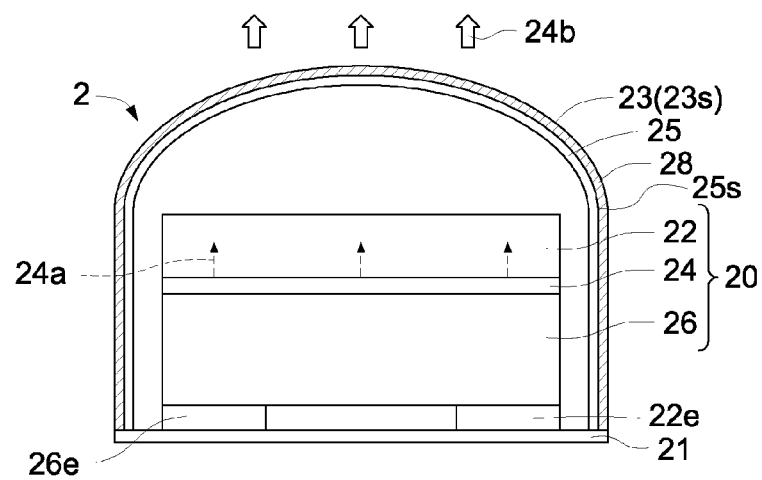
FIG. 15 illustrates a diagram of a light-emitting device in accordance with a second embodiment of the present application.

As shown in FIG. 15, the first thermal-sensitive layer 28 of the light-emitting device 2 can be formed on the surface 23s of the light-pervious layer 23. In another example, the first thermal-sensitive layer 28 contacts with the surface 23s of the light-pervious layer 23. The wavelength converting material 25 can be formed on a surface 25s of the first thermal-sensitive layer 28 through an adhesion material, such as resin, wherein the surface 25s is more close to the first semiconductor light-emitting structure 20.

Figure 16:
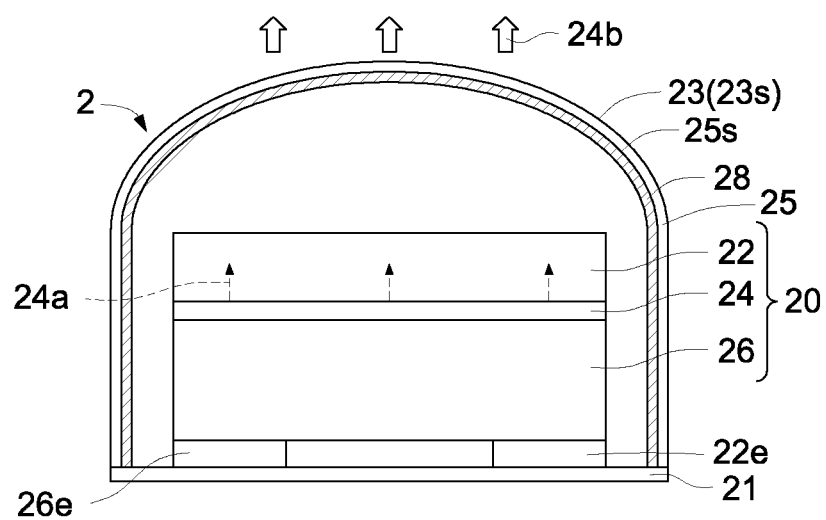
FIG. 16 illustrates a diagram of a light-emitting device in accordance with a second embodiment of the present application.

As shown in FIG. 16, the first thermal-sensitive layer 28 of the light-emitting device 2 can be formed on the surface 23s of the light-pervious layer 23. In another example, the first thermal-sensitive layer 28 contacts with the surface 23s of the light-pervious layer 23. The wavelength converting material 25 can be formed on a surface 25s of the first thermal-sensitive layer 28 through an adhesion material, such as resin, wherein the surface 25s is away from the first semiconductor light-emitting structure 20.

Figure 17:
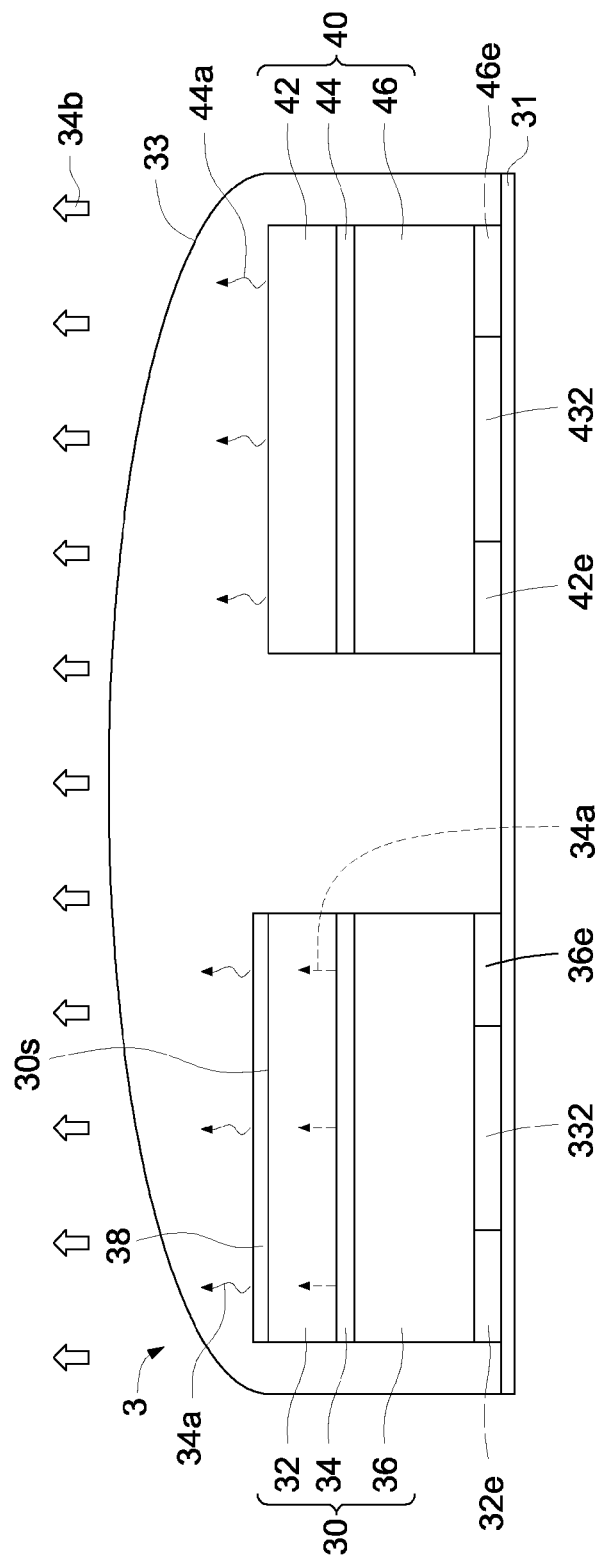
FIG. 17 illustrates a diagram of a light-emitting device in accordance with a third embodiment of the present application.

FIG. 17 illustrates a cross-sectional diagram of a light-emitting device 3 in accordance with a third embodiment of the present application. The light-emitting device 3 comprises a substrate 31; a first semiconductor light-emitting structure 30 formed on the substrate 31, wherein the first semiconductor light-emitting structure 30 comprises a first semiconductor layer 32 having a first conductivity type, a second semiconductor layer 36 having a second conductivity type and a first active layer 34 formed between the first semiconductor layer 32 and the second semiconductor layer 36, wherein the first active layer 34 is capable of emitting a first light 34a having a first dominant wavelength; a light-pervious layer 33 covering the first semiconductor light-emitting structure 30; and a first thermal-sensitive layer 38 formed on a path of the first light 34a, wherein the first thermal-sensitive layer 38 comprises a material characteristic which varies with the temperature change.

As shown in FIG. 17, the first thermal-sensitive layer 38 of the light-emitting device 3 can be formed on at least one surface 30s of the first semiconductor light-emitting structure 30, and preferably, the first thermal-sensitive layer 38 contacts with the surface 30s of the first semiconductor light-emitting structure 30.

The material of the light-pervious layer 33 comprises organic material or inorganic material. The organic material comprises epoxy, polymethylmethacrylate (PMMA), or silicone. The inorganic material comprises glass. The manufacturing method of the light-pervious layer 33 is not particularly limited, in addition to potting, the light-pervious layer 33 can also be formed by low-pressure transfer molding or adhesion. The first light 34a emitted from the first semiconductor light-emitting structure 30 can be transmitted to the environment through the light-pervious layer 33. The light-pervious layer 33 also provides electrical insulation and heat resistance. The light-pervious layer 33 protects the first semiconductor light-emitting structure 30 from being directly exposed to the environment.

The material of the first semiconductor light-emitting structure 30 comprises an element selected from a group consisting of arsenic (As), gallium (Ga), aluminum (Al), indium (In), phosphorus (P), nitrogen (N), zinc (Zn), cadmium (Cd) and selenium (Se). In an embodiment of the present application, the first conductivity type of the first semiconductor layer 32 is different from the second conductivity type of the second semiconductor layer 36. For example, the first semiconductor layer 32 can be an n-type semiconductor layer and the second semiconductor layer 36 can be a p-type semiconductor layer. The electrons provided from the n-type semiconductor layer and the holes provided from the p-type semiconductor layer combine in the first active layer 34 to emit the first light 34a under an external electrical current driving. The manufacturing method of the first semiconductor light-emitting structure 30 is not particularly limited, the first semiconductor light-emitting structure 30 may be formed by a known epitaxy method such as metallic-organic chemical vapor deposition (MOCVD) method, a molecular beam epitaxy (MBE) method, a hydride vapor phase epitaxy (HVPE) method, sputtering or electrical plating.

The first semiconductor light-emitting structure 30 can be formed on the substrate 31 by glue bonding or metal bonding. The substrate 31 comprises conductive material, such as metal. The first semiconductor light-emitting structure 30 further comprises a first electrode 32e and a second electrode 36e, wherein a position of the first electrode 32e or the second electrode 36e is not particularly limited. The first electrode 32e and the second electrode 36e can be formed on a same side of the first semiconductor light-emitting structure 30 to form a horizontal structure as shown in FIG. 17. The first electrode 32e and the second electrode 36e also can be formed on opposite sides of the first semiconductor light-emitting structure 30 to form a vertical structure (not shown). As shown in FIG. 17, a cavity 332 formed between the first electrode 32e and the second electrode 36e comprises insulated glue material or air when the first electrode 32e and the second electrode 36e are formed on the same side of the first semiconductor light-emitting structure 30.

The material characteristic of the first thermal-sensitive layer 38 comprises transmittance which varies with the temperature change. The transmittance is proportional to the temperature. Specifically, the transmittance increases when the temperature is raised. The material of the first thermal-sensitive layer 38 comprises organic compound or inorganic compound. The organic compound comprises esters or phenols, for example, crystal violet lactone, malachite green lactone, or cresol red, or metal organic complex compound, for example, copper complex compound, or liquid crystal. The inorganic compounds comprise inorganic salts, such as vanadate or chromate, or inorganic crystals, such as mercuric iodide, silver iodide or vanadium oxide. When the organic compound or the inorganic compound is used as the material of the first thermal-sensitive layer 38, the transmittance of the material varies with the temperature change of the light-emitting device 3. As shown in FIG. 3, the transmittance of the material increases with increasing temperature. The material is reversible and can be reused. When the temperature gets back, the transmittance also gets back to a value before temperature increasing. With the transmittance dependence on temperature of the thermal-sensitive material of the first thermal-sensitive layer 38, the color temperature variation of the light-emitting device 3 is improved.

In accordance with another embodiment of the present application, the material of the first thermal-sensitive layer 38 of the light-emitting device 3 can be liquid crystal. The material characteristic comprises an arrangement of the liquid crystal molecules.

As shown in FIG. 17, the light-emitting device 3 of the third embodiment of the present application further comprises at least a second semiconductor light-emitting structure 40 formed on the substrate 31, wherein the second semiconductor light-emitting structure 40 is adjacent to the first semiconductor light-emitting structure 30 and covered by the light-pervious layer 33 with the first semiconductor light-emitting structure 30. The second semiconductor light-emitting structure 40 comprises a third semiconductor layer 42 having a first conductivity type, a fourth semiconductor layer 46 having a second conductivity type and a second active layer 44 formed between the third semiconductor layer 42 and the fourth semiconductor layer 46, wherein the second active layer 44 is capable of emitting a second light 44a having a second dominant wavelength, wherein the second dominant wavelength of the second light 44a is different from the first dominant wavelength of the first light 34a.

The material of the first semiconductor light-emitting structure 40 comprises an element selected from a group consisting of arsenic (As), gallium (Ga), aluminum (Al), indium (In), phosphorus (P), nitrogen (N), zinc (Zn), cadmium (Cd) and selenium (Se). In an embodiment of the present application, the first conductivity type of the first semiconductor layer 42 is different from the second conductivity type of the second semiconductor layer 46. For example, the first semiconductor layer 42 can be an n-type semiconductor layer and the second semiconductor layer 46 can be a p-type semiconductor layer. The electrons provided from the n-type semiconductor layer and the holes provided from the p-type semiconductor layer combine in the first active layer 44 to emit the first light 44a under an external electrical current driving. The manufacturing method of the first semiconductor light-emitting structure 40 is not particularly limited, the first semiconductor light-emitting structure 40 may be formed by a known epitaxy method such as metallic-organic chemical vapor deposition (MOCVD) method, a molecular beam epitaxy (MBE) method, a hydride vapor phase epitaxy (HVPE) method, sputtering or electrical plating.

The second semiconductor light-emitting structure 40 can be formed on the substrate 31 by glue bonding or metal bonding. The second semiconductor light-emitting structure 40 further comprises a third electrode 42e and a fourth electrode 46e, wherein a position of the third electrode 42e or the fourth electrode 46e is not particularly limited. The third electrode 42e and the fourth electrode 46e can be formed on a same side of the second semiconductor light-emitting structure 40 to form a horizontal structure as shown in FIG. 17. The third electrode 42e and the fourth electrode 46e also can be formed on opposite sides of the second semiconductor light-emitting structure 40 to form a vertical structure (not shown). As shown in FIG. 17, a cavity 432 formed between the third electrode 42e and the fourth electrode 46e comprises insulated glue material or air when the third electrode 42e and the fourth electrode 46e are formed on the same side of the second semiconductor light-emitting structure 40.

As shown in FIG. 17, the first light 34a of the first semiconductor light-emitting structure 30 can be mixed with the second light 44a of the second semiconductor light-emitting structure 40 to emit a fourth light 34b having a fourth dominant wavelength, wherein the first light 34a can be a red light, the second light 44a can be a blue light, the fourth light 34b can be a white light.

Figure 18:
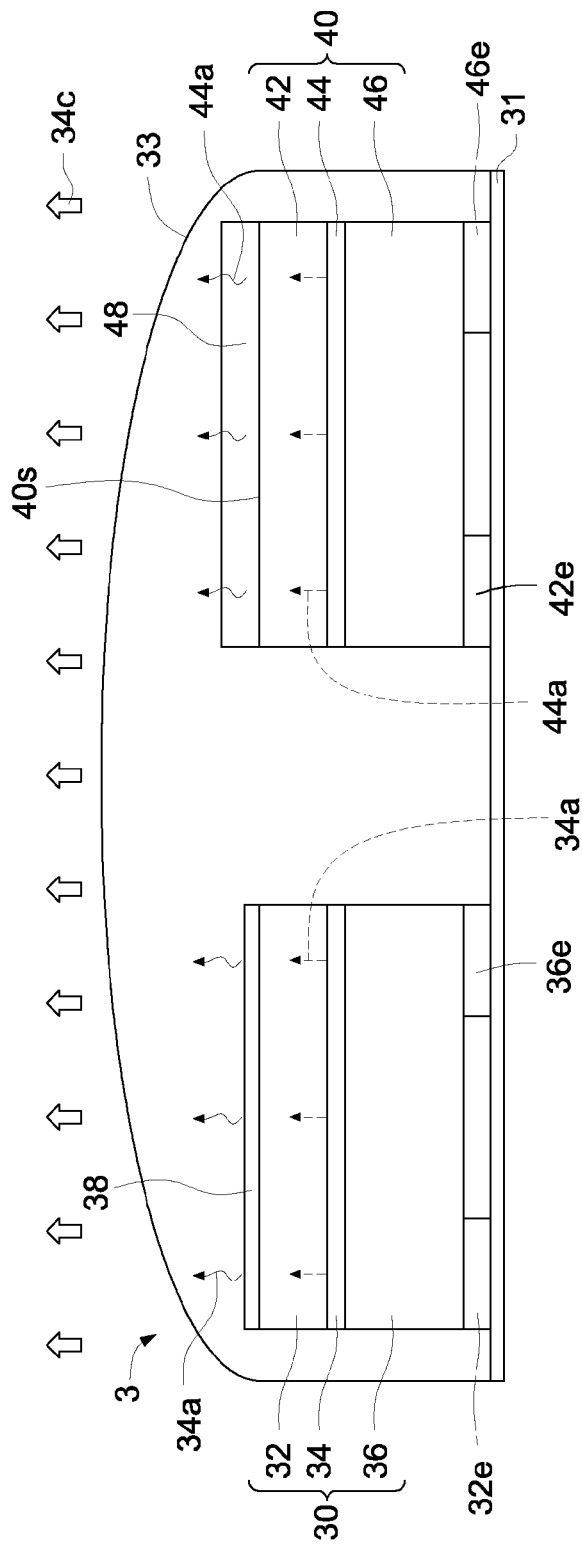
FIG. 18 illustrates a diagram of a light-emitting device in accordance with a third embodiment of the present application.

As shown in FIG. 18, the light-emitting device 3 of the third embodiment of the present application further comprises a second thermal-sensitive layer 48 formed on at least one surface 40s of the second semiconductor light-emitting structure 40, and preferably, contacts with at least one surface 40s of the second semiconductor light-emitting structure 40, wherein the second thermal-sensitive layer 48 comprises a material different from that of the first thermal-sensitive layer 38. In one example of the embodiment, a thickness of the second thermal-sensitive layer 48 is different from that of the first thermal-sensitive layer 38. The first semiconductor light-emitting structure 30 and the second semiconductor light-emitting structure 40 have a different degree of photo decay on temperature, different materials or different thickness of the first thermal-sensitive layer 38 and the second thermal-sensitive layer 48 can be used to adjust the light intensity of the first semiconductor light emitting structure 30 and the second semiconductor light-emitting structure 40 to improve the variation of the color temperature of the light-emitting device 3.

In the embodiment, an electrical current can be injected into the first electrode 32e and the second electrode 36e of the first semiconductor light-emitting structure 30 and the third electrode 42e and the fourth electrode 46e of the second semiconductor light-emitting structure 40 through the substrate 31 of the light-emitting device 3. The first semiconductor light-emitting structure 30 and the second semiconductor light-emitting structure 40 have a different degree of photo decay on temperature, when a temperature of the light-emitting device 3 increases from a room temperature, such as 25° C., to a temperature higher than the room temperature, such as 85° C., the photo decay of the light intensity of the first light 34a, for example, the red light, is larger than the photo decay of the light intensity of the second light 44a, for example, the blue light. The first semiconductor light-emitting structure 30 and the second semiconductor light-emitting structure 40 have a different degree of photo decay on temperature, the first thermal-sensitive layer 38 and the second thermal-sensitive layer 48 can be used to reduce the variation of the color temperature of the light-emitting device 3 between room temperature and thermal equilibrium.

Figure 19:
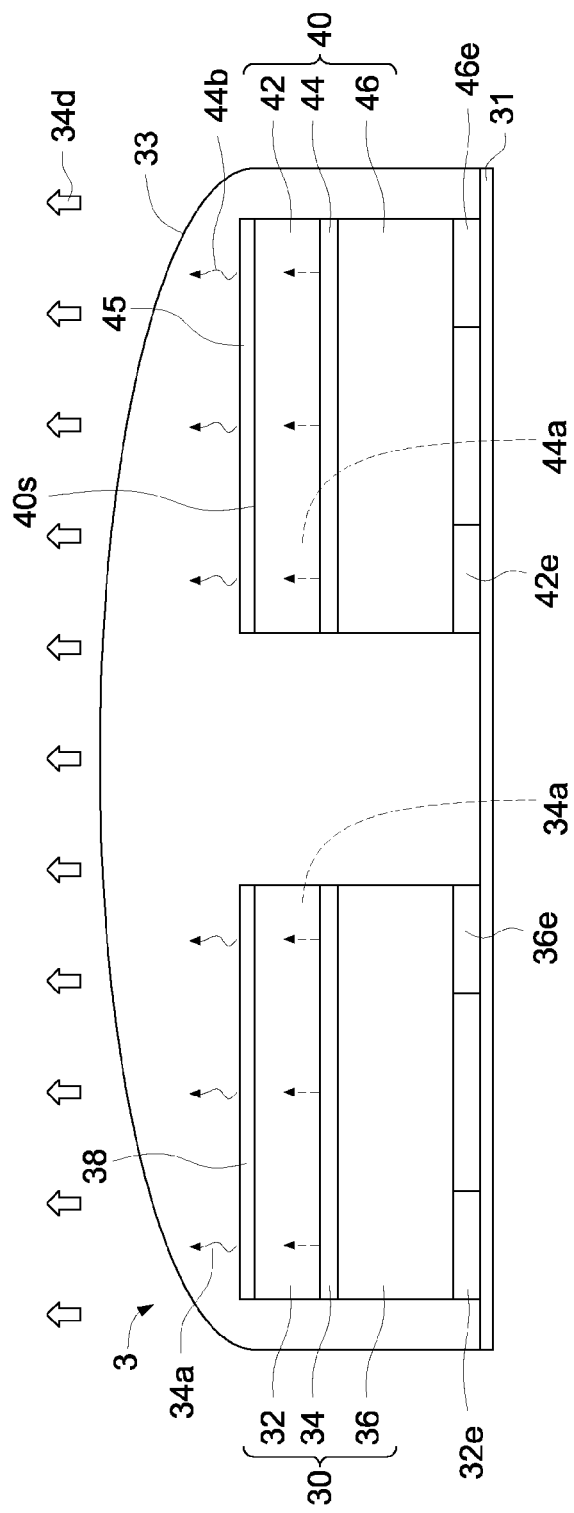
FIG. 19 illustrates a diagram of a light-emitting device in accordance with a third embodiment of the present application.

As shown in FIG. 19, the light-emitting device 3 further comprises a wavelength converting material 45 formed on a path of the second light 44a. In an embodiment of the present application, the wavelength converting material 45 can be formed on at least one surface 40s of the second semiconductor light-emitting structure 40 through an adhesion material, such as resin. Preferably, the wavelength converting material 45 contacts with at least one surface 40s of the second semiconductor light-emitting structure 40. The wavelength converting material 45, for example, phosphor, is capable of absorbing the second light 44a emitted from the second active layer 44 and emitting a third light 44b having a third dominant wavelength. The first light 34a of the first semiconductor light-emitting structure 30 can be mixed with the third light 44b of the second semiconductor light-emitting structure 40 to emit a fourth light 34d having a fourth dominant wavelength, wherein the first light 34a can be a red light, the second light 44b can be a white light, the fourth light 34d can be a white light.

Figure 1A:
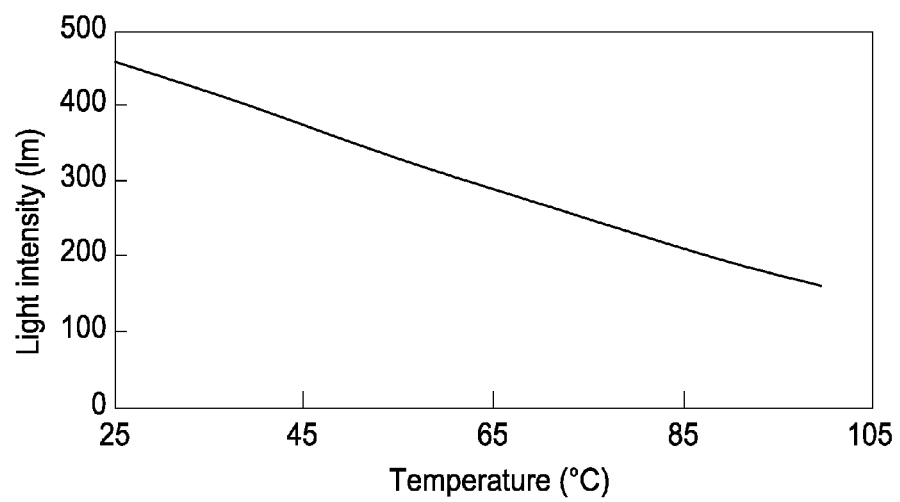
FIG. 1A illustrates a diagram of light intensity dependence on temperature of a conventional red chip.
Figure 1B:
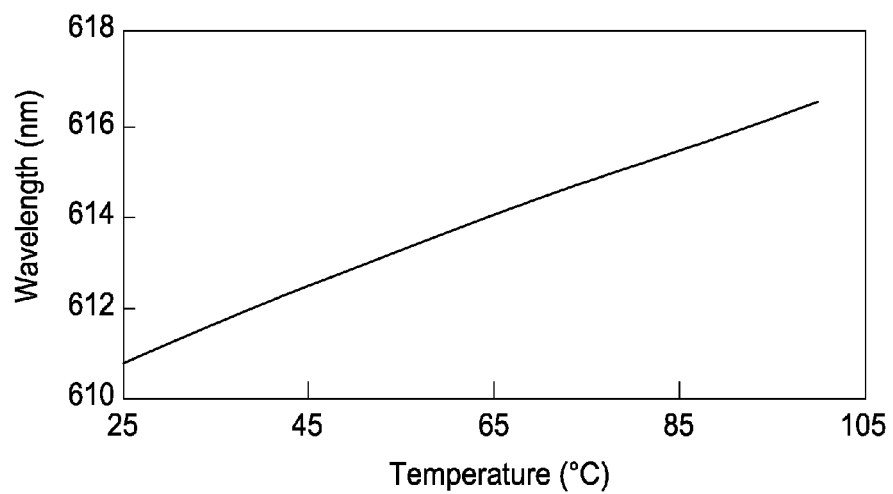
FIG. 1B illustrates a diagram of emission wavelength dependence on temperature of a conventional red chip.
Figure 20:
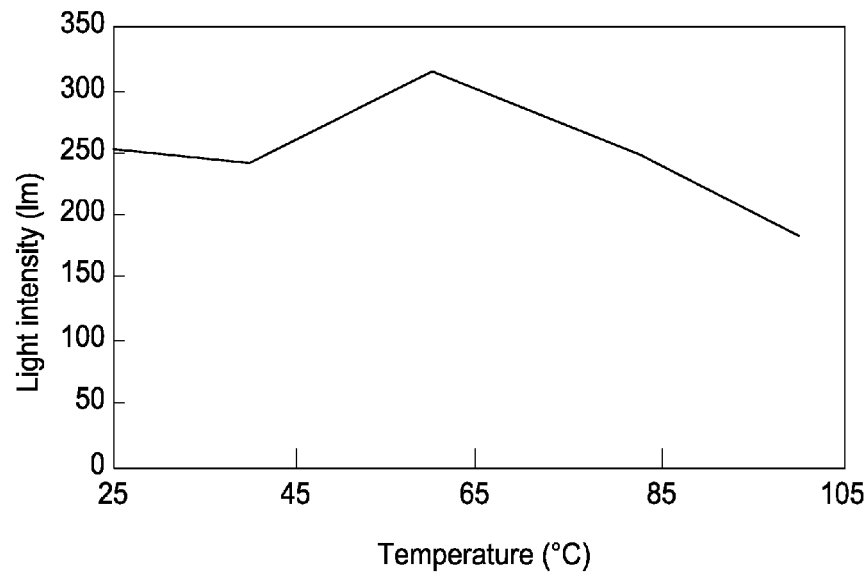
FIG. 20 illustrates a diagram of light intensity dependence on temperature of a light-emitting device of the present application.
Figure 21:
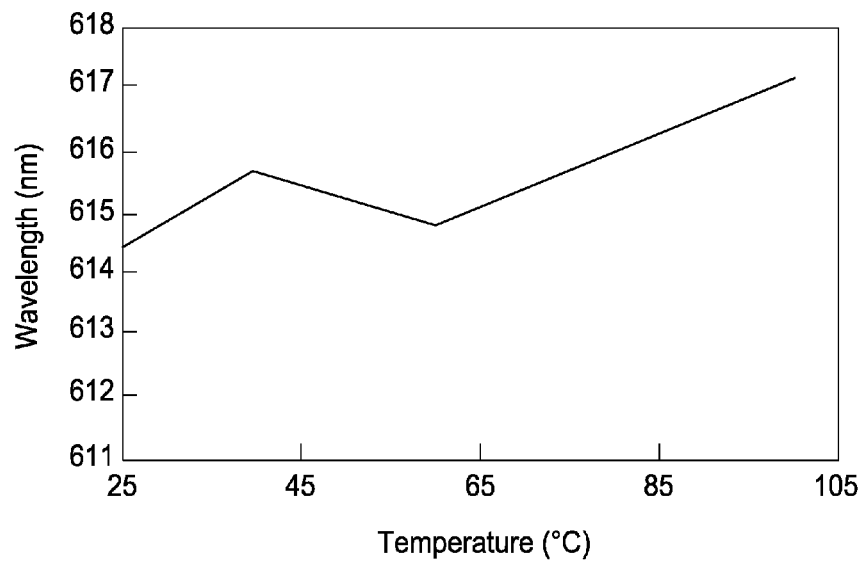
FIG. 21 illustrates a diagram of emission wavelength dependence on temperature of a light-emitting device of the present application.

FIG. 20 illustrates a diagram of light intensity dependence on temperature of a light-emitting device of the present application. As shown in FIG. 20, when an electrical current is injected into the light-emitting device, a temperature of the light-emitting device increases from an original room temperature, such as 25° C., to a higher temperature, such as 85° C. or above, the light intensity of the light-emitting device at 25° C. is 50~85% of that of the red chip shown in FIG. 1A. The attenuation rate of the light intensity versus temperature of the light-emitting device of the present application is approximately −0.05~0.4%. FIG. 21 illustrates a diagram of emission wavelength dependence on temperature of a light-emitting device of the present application. As shown in FIG. 21, when the external electrical current is injected into the light-emitting device, the temperature of the light-emitting device increases from an original temperature to a higher temperature, such as from 25° C. to 85° C. or above. When the temperature increases from 25° C. to 100° C., the emission wavelength of the light-emitting device increases 2~3 nm.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A light-emitting device, comprising:
   a substrate;
   a first semiconductor light-emitting structure formed on the substrate, wherein the first semiconductor light-emitting structure comprises:
   a first semiconductor layer having a first conductivity type;
   a second semiconductor layer having a second conductivity type; and
   a first active layer formed between the first semiconductor layer and the second semiconductor layer, wherein the first active layer is capable of emitting a first light having a first dominant wavelength; and
   a first thermal-sensitive layer formed on a path of the first light, wherein the first thermal-sensitive layer comprises a material characteristic which varies within a temperature range and a first intensity difference of the first light after being transmitted through the first thermal-sensitive layer within the temperature range is smaller than a second intensity difference of the first light before being transmitted into the first thermal-sensitive layer within the temperature range.

2. The light-emitting device of claim 1, wherein the first thermal-sensitive layer contacts with one surface of the first semiconductor light-emitting structure.

3. The light-emitting device of claim 1, further comprising a light-pervious layer covering the first semiconductor light-emitting structure.

4. The light-emitting device of claim 3, wherein the first thermal-sensitive layer is formed between the light-pervious layer and the first semiconductor light-emitting structure.

5. The light-emitting device of claim 1, further comprising a wavelength converting material formed on the path of the first light.

6. The light-emitting device of claim 5, wherein the wavelength converting material is formed in the light-pervious layer.

7. The light-emitting device of claim 5, further comprising a second semiconductor light-emitting structure formed on the substrate, adjacent to the first semiconductor light-emitting structure and covered by the light-pervious layer, wherein the second semiconductor light-emitting structure comprises:
   a third semiconductor layer having the first conductivity type;
   a fourth semiconductor layer having the second conductivity type; and
   a second active layer formed between the third semiconductor layer and the fourth semiconductor layer, wherein the second active layer is capable of emitting a second light having a second dominant wavelength.

8. The light-emitting device of claim 7, wherein the wavelength converting material is formed on a surface of the first semiconductor light-emitting structure.

9. The light-emitting device of claim 7, further comprising a second thermal-sensitive layer formed on a surface of the second semiconductor light-emitting structure.

10. The light-emitting device of claim 9, wherein a material and/or a thickness of the second thermal-sensitive layer is different from that of the first thermal-sensitive layer.

11. The light-emitting device of claim 3, wherein the first thermal-sensitive layer is formed on the light-pervious layer.

12. The light-emitting device of claim 3, further comprising a wavelength converting material formed on the light-pervious layer.

13. The light-emitting device of claim 1, wherein the material characteristic includes at least one of transmittance and refractive index.

14. The light-emitting device of claim 13, wherein the transmittance with respect to the first light is directly proportional to the temperature in the temperature range.

15. The light-emitting device of claim 1, wherein the thermal-sensitive layer comprises organic compound, inorganic compound, or liquid crystal.

16. The light-emitting device of claim 13, wherein the thermal-sensitive layer comprises a first material having a first refractive index and a second material having a second refractive index.

17. The light-emitting device of claim 16, wherein a difference between the first refractive index and the second refractive index is substantially smaller than 10% when a junction temperature of the active layer is above 60° C.

18. The light-emitting device of claim 17, wherein the first material comprises liquid crystal and the second material comprises resin.

19. The light-emitting device of claim 1, wherein the first light comprises red light.

20. The light-emitting device of claim 1, wherein the temperature range comprises a first temperature and a second temperature higher than the first temperature, and an intensity of the first light attenuates from the first temperature to the second temperature.

* * * * *